United States Patent
Hoelen et al.

(10) Patent No.: US 7,482,567 B2
(45) Date of Patent: Jan. 27, 2009

(54) OPTICAL FEEDBACK SYSTEM WITH IMPROVED ACCURACY

(75) Inventors: Christoph Gerard August Hoelen, Eindhoven (NL); Johannes Petrus Maria Ansems, Eindhoven (NL); Edwin Van Lier, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/575,515

(22) PCT Filed: Aug. 18, 2005

(86) PCT No.: PCT/IB2005/052722

§ 371 (c)(1),
(2), (4) Date: Mar. 19, 2007

(87) PCT Pub. No.: WO2006/033031

PCT Pub. Date: Mar. 30, 2006

(65) Prior Publication Data

US 2008/0093530 A1    Apr. 24, 2008

(30) Foreign Application Priority Data

Sep. 24, 2004   (EP)  .................................. 04104641

(51) Int. Cl.
*G01J 1/32* (2006.01)
*H01J 3/14* (2006.01)
(52) U.S. Cl. .................. 250/205; 250/216; 362/327; 362/231
(58) Field of Classification Search .................. 250/205, 250/216; 345/76, 77; 362/326–340, 552, 362/231; 359/726–731, 856–861
See application file for complete search history.

(56) References Cited

U.S. PATENT DOCUMENTS

| 4,675,531 | A  | * | 6/1987 | Clark et al. .................. 250/568 |
| 6,200,002 | B1 |   | 3/2001 | Marshall et al. |
| 2002/0033459 | A1 | * | 3/2002 | Graves et al. ............... 250/573 |
| 2002/0047624 | A1 |   | 4/2002 | Stam et al. |
| 2002/0080615 | A1 |   | 6/2002 | Marshall et al. |
| 2002/0080622 | A1 |   | 6/2002 | Pashley et al. |
| 2002/0130326 | A1 |   | 9/2002 | Tamura et al. |

(Continued)

FOREIGN PATENT DOCUMENTS

JP    09200429    7/1997

(Continued)

*Primary Examiner*—Thanh X Luu

(57) ABSTRACT

The illumination system has a plurality of light emitters (R, G, B) and a light-collimator (1) for collimating light emitted by the light emitters. Light propagation in the light-collimator is based on total internal reflection (TIR) towards a light-exit window (4) of the light-collimator. At least one light sensor (8) for optical feedback is placed outside the light-collimator and is arranged to receive light emitted by the light emitters exclusively through reflection at the light-exit window of the light-collimator. Preferably, the light sensor is placed substantially coplanar with the light emitters. Preferably, a side wall (35) of the light-collimator is provided with a protruding portion (9) for guiding the light reflected at the light-exit window of the light-collimator towards the light sensor. Preferably, the illumination system is provided with a reflector (12). Preferably, the illumination system comprises a holographic diffuser (17). Accurate sensing of the color mixing of light emitted by the illumination system is obtained.

15 Claims, 3 Drawing Sheets

U.S. PATENT DOCUMENTS

| | | |
|---|---|---|
| 2003/0020415 A1 | 1/2003 | Bruning |
| 2003/0043107 A1 | 3/2003 | Ruby et al. |
| 2003/0107887 A1 | 6/2003 | Eberl |
| 2003/0116773 A1 | 6/2003 | Kraus et al. |
| 2003/0234342 A1 | 12/2003 | Gaines et al. |
| 2006/0093011 A1 * | 5/2006 | Vancoille .................... 372/101 |

FOREIGN PATENT DOCUMENTS

| | | |
|---|---|---|
| WO | 0201921 A1 | 1/2002 |
| WO | 02052902 | 7/2002 |
| WO | 02099333 A | 12/2002 |
| WO | 03086023 A1 | 10/2003 |

* cited by examiner

OPTICAL FEEDBACK SYSTEM WITH IMPROVED ACCURACY

The invention relates to an illumination system comprising a plurality of light emitters, a light-collimator and a light sensor.

Such illumination systems are known per se. They are used, inter alia, as backlighting of (image) display devices, for example for television receivers and monitors. Such illumination systems can particularly suitably be used as a backlight for non-emissive displays, such as liquid crystal display devices, also referred to as LCD panels, which are used in (portable) computers or (cordless) telephones. Another application area of the illumination system according to the invention is the use as illumination source in a digital projector or so-called beamer for projecting images or displaying a television program, a film, a video program or a DVD, or the like. In addition, such illumination systems are used for general lighting purposes, such as spot lights, accent lighting, flood lights and for large-area direct-view light emitting panels such as applied, for instance, in signage, contour lighting, and billboards. In other applications, the light emitted by such illumination systems is fed into a light guide, optical fiber or other beam-shaping optics.

Generally, such illumination systems comprise a multiplicity of light emitters, for instance light-emitting diodes (LEDs). LEDs can be light sources of distinct primary colors, such as, for example the well-known red (R), green (G), or blue (B) light emitters. In addition, the light emitter can have, for example, amber, magenta or cyan as primary color. These primary colors may be either generated directly by the light-emitting-diode chip, or may be generated by a phosphor upon irradiance with light from the light-emitting-diode chip. In the latter case, also mixed colors or white light is possible as one of the primary colors. Generally, the light emitted by the light emitters is mixed in the transparent element(s) to obtain a uniform distribution of the light while eliminating the correlation of the light emitted by the illumination system to a specific light emitter. In addition, it is known to employ a controller with a sensor and some feedback algorithm in order to obtain high color accuracy and/or luminous flux accuracy.

PCT patent application WO-A 02/01921 describes an illumination device with light emitting diodes (LEDs) and a LED support element on which a number of light pixels are arranged which emit light. Said light pixels each comprise a number of LEDs with emission wavelengths suitable for additive color mixing of the light from the light pixels. A controller is provided on the LED support element, by means of which a color temperature and intensity parameter of the additively color mixed light of each individual light pixel may be set. The controller assigns electrical LED currents to the color temperature and intensity parameters and controls the LEDs in the light pixels by means of the assigned LED currents. Control devices measure the color temperature and intensity of the emitted light of at least one light pixel, compare the measured and the pre-set color temperature and intensity parameters of the light pixel and in the case of a difference in the measured and pre-set color temperature and intensity parameters regulates the controller such that the emitted light from the light pixel has the pre-set color temperature and intensity parameters.

A drawback of the known illumination system is that the sensing of the color mixing of the light emitted by the illumination system is not very accurate.

The invention has for its object to eliminate the above disadvantage wholly or partly. According to the invention, this object is achieved by an illumination system comprising:

a plurality of light emitters,
a light-collimator for collimating light emitted by the light emitters,
light propagation in the light-collimator being based on total internal reflection,
at least one light sensor for optical feedback being placed outside the light-collimator,
the light sensor being arranged to receive light emitted by the light emitters exclusively through reflection at a light-exit window of the illumination system.

By placing the light sensor outside the light-collimator and by measuring the light emitted by the light emitters exclusively through reflection, color and/or luminous flux mixing of the light from the plurality of light emitters is sensed with high accuracy. Direct light emitted by a light emitter hitting the light sensor is avoided. In this manner, the direct light emitted by a certain light emitter is not dominating the color sensing in the light sensor. According to the invention, an illumination system with accurate sensing of the color mixing of the light emitted by the illumination system is obtained.

The light-exit window of the illumination system is either a light-exit window of the light-collimator or a light-exit window of the illumination system or any possible further interface located between the light collimator and the light-exit window of the illumination system.

In addition, by basing the propagation of light in the light-collimator on total internal reflection (TIR), light losses in the light-collimator section are largely avoided. The distribution of light emitted by the illumination system according to the invention is substantially uniform. Depending on the dimensions of the illumination system, the light emitted by the illumination system is substantially mixed in a spatial as well as in an angular manner. In addition, the light emitted by the illumination system is substantially collimated (paralleled). Preferably, the light-collimator is made of a non-gaseous, optically transparent dielectric material. Preferably, the light-collimator is made from a dielectric material with a refractive index larger than or equal to 1.3.

Preferably, the light sensor is connected to a controller for controlling the electrical current of the light emitters in response to the light received by the light sensor. If the signal detected in the light sensor deviates from the desired signal that corresponds with the desired light output of the illumination system, the controller regulates the output of the light emitters meeting the requirements of the light output of the illumination system.

There are various manners in which the controller operates. In a favorable embodiment of the illumination system, the controller employs time-resolved detection. This arrangement makes the controller independent to ambient light. Preferably, detection in the controller is synchronous with pulse-width driving of the light-emitters. Alternatively, the controller employs frequency-resolved detection in combination with a driving scheme of the light emitters that operates in pre-defined frequency bands. Assigning unique frequencies to the various primary colors enables color-resolved luminous flux detection without the need to apply color filters. In this manner, either employing time-resolved detection or frequency-resolved detection, the flux of each (primary) color is measured independently of the other (primary) colors.

In an alternative embodiment of the illumination system at least two sensors are supplied with color filters such that the color point of the light emitted from the illumination system can be determined and used to adjust the color point of the light. In this embodiment, the fraction of the luminous flux emitted by the light emitters from the same color that reaches the sensors is homogenized such that at least the sensors with identical color filters sense essentially the same fraction of light from the various light emitters. In this manner the detected signals correspond (per color) with the overall luminous flux (per color) emitted by the illumination system independently from luminous flux variations between the light emitters emitting the same color of light. This approach enables color point detection even in the case of DC operation of the light emitters. As an example, three sensors with a spectral response corresponding with the tristimulus curves (CIE 1931, standard observer) could be used to determine the color point. Alternatively, sensors with other spectral responsivity can be applied in combination with a calibration matrix. In those cases where there is only a single degree of freedom in setting the color point of the light, i.e., the possible settings of the color point are limited to points on a curve in the color space, two sensors with appropriate different spectral responsivity are sufficient to determine the color point of the light and to provide a suitable feed back signal to realize (set and maintain) the required light output characteristics, as well with respect to the color point as with respect to the total luminous flux. Alternatively, a separate sensor is used to set and maintain the luminous flux by providing a feed back signal resulting in an adjustment of the currents from the driver(s) to the light emitters.

In a further preferred embodiment of the illumination system according to the invention the control system that provides the appropriate currents to the light emitters, such that the optical characteristics of the light emitted from the illumination system corresponds with the desired settings, is based on input signals from at least one optical sensor in combination with at least one thermal sensor. In this manner information on the light emitting properties of the light emitters can be derived from the temperature of the light emitters. This enables the application of spectrally unresolved flux sensing or the application of sensors (provided with color filters) with a spectral response other than those corresponding with the tristimulus curves. By way of example, the spectral shift of the light emitted from LEDs as a function of temperature can be used to derive the actual position of the peak wavelength of the light without the need to detect this optically by using the signal from a temperature sensor. Because the temperature sensor will not sense the actual temperature of the active layer of the light emitter directly, but instead is only capable of sensing the temperature at some distance from the light generating layer, a correction for this difference may be incorporated in the control system.

In yet another preferred configuration the temperature of the light emitters is derived from the voltage at a predefined current, which is a function of temperature. In this manner, no separate temperature sensor is required and the temperature of the light emitter is derived from a calibration curve that provides the relation between the temperature and the electrical characteristics of the light emitters. This information is combined together with the signals from the optical sensors to accurately set and maintain the output of the lighting system by a feed back and/or feed forward control system.

A preferred embodiment of the illumination system according to the invention is characterized in that the light sensor is placed substantially coplanar with the light emitters. This arrangement simplifies the design of the illumination system. Preferably, the light sensor is placed in the same housing as the light emitters. In this manner, the light sensor is insensitive for receiving ambient light.

In order to stimulate the reception of light by the light sensor, a favorable embodiment of the illumination system is characterized in that a side wall of the light-collimator is provided with a protruding portion for guiding the light reflected at a light-exit window of the illumination system towards the light sensor. This protruding portion guides the reflected light emitted by the light emitters towards the light sensor. Preferably, the cross-section of this protruding portion at the connection of the side wall of the light-collimator is optimized to minimize distortion of the color mixing in the light-collimator and to guide sufficient light towards the light sensor.

The collimation of the light emitted by the illumination system can be further improved by providing additional means for collimating the light emitted by the light emitters. To this end a preferred embodiment of the illumination system according to the invention is characterized in that the light-collimator is provided with a reflector. This reflector further collimates the beam of light emitted by the illumination system.

There are various ways to realize the reflector. In a first embodiment, the reflector comprises a conical shape broadening from the light-collimator. In a further embodiment, the reflector is facetted for further enhancing the homogenization of the light beam emitted by the illumination system. In yet a further embodiment, the reflector is substantially shaped according to a compound parabolic concentrator (CPC). Combinations of the embodiments of the reflectors are possible.

A favorable embodiment of the illumination system according to the invention is characterized in that the illumination system comprises a light-shaping diffuser, in particular, a holographic diffuser. Preferably, the holographic diffuser is a randomized holographic diffuser. The primary effect of the holographic diffuser is that a uniform spatial and angular color and light distribution is obtained. By the nature of the holographic diffuser, the dimensions of the holographic diffuser, or beam shaper, are so small that no details are projected on a target, thus resulting in a spatially and/or angularly smoothly varying, homogeneous beam pattern. A secondary effect of a holographic diffuser is the causing of a change in the shape of the light beam emitted by the illumination system.

These and other aspects of the invention are apparent from and will be elucidated with reference to the embodiments described hereinafter.

In the drawings.

The Figures are purely diagrammatic and not drawn to scale. Notably, some dimensions are shown in a strongly exaggerated form for the sake of clarity. Similar components in the Figures are denoted as much as possible by the same reference numerals.

Figure 1:
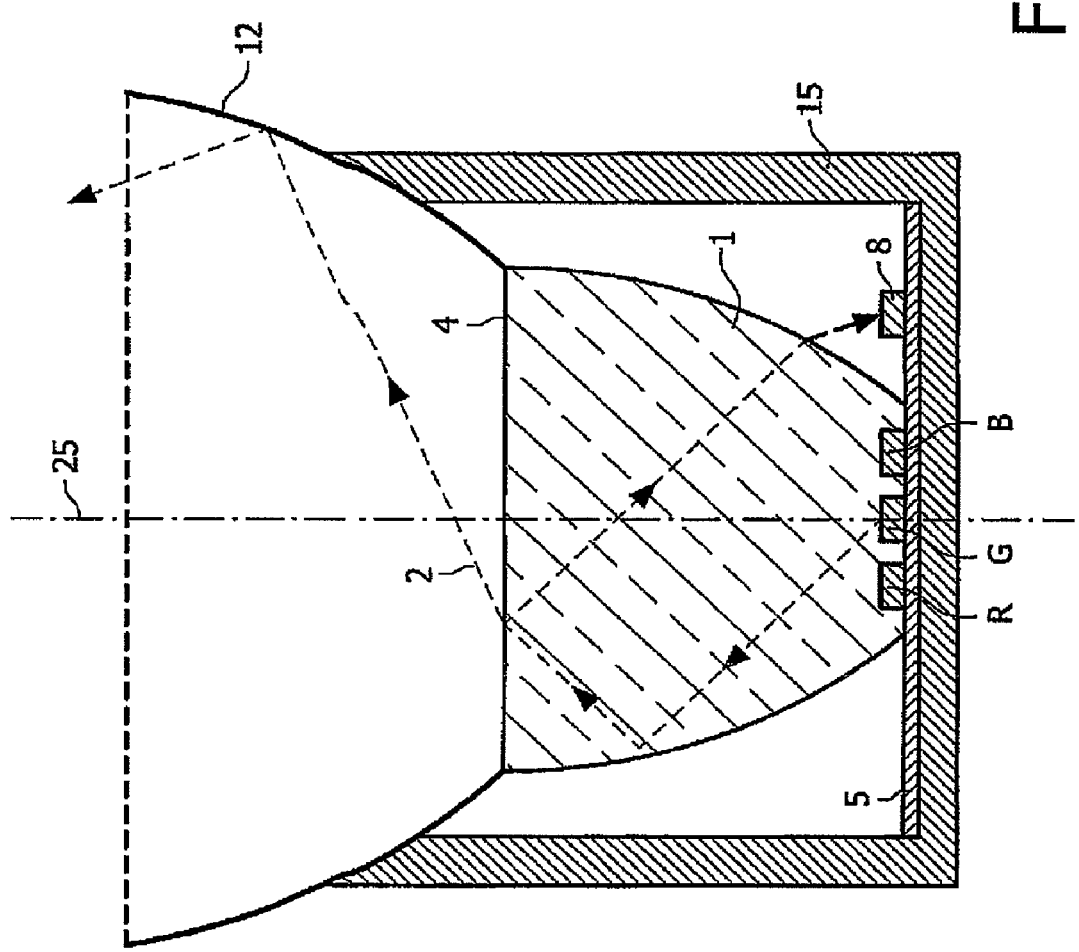
FIG. 1 is a cross-sectional view of a first embodiment of the illumination system according to the invention.

FIG. 1 very schematically shows a cross-sectional view of a first embodiment of the illumination system according to the invention. The illumination system comprises a plurality of light emitters R, G, B for instance a plurality of light-emitting diodes (LEDs). LEDs can be light emitters of distinct primary colors, such as in the example of FIG. 1, the well-known red R, green G, or blue B light emitters. Preferably, the light emitters comprise at least a first light-emitting diode R of a first primary color, at least a second light-emitting diode G of a second primary color, and at least a third light-emitting diode B of a third primary color, the three primary colors being distinct from each other. Alternatively, the light emitter can have, for example, amber, magenta or cyan as primary color. The primary colors may be either generated directly by the light-emitting-diode chip, or may be generated by a phosphor upon irradiance with light from the light-emitting-diode chip. In the latter case, also mixed colors or white light is possible as one of the primary colors. Alternatively, the illumination system can be provided with a plurality of light emitters with only two primary colors, for instance a combination of white and amber light emitters.

In the example of FIG. 1, the LEDs R, G, B are mounted on a substrate 5 providing electrical connection to the LEDs and serving as heat conductor to spread and transport the heat away from the light emitters. Such a substrate can be, for example, an insulated metal substrate such as a metal core printed circuit board, a silicon or ceramic substrate provided with the electrical leads and appropriate electrode patterns for connecting the LEDs, or substrates from composite materials such as carbon fiber reinforced metal substrates. In the example of FIG. 1, the LEDs and the light sensor(s) are mounted on the same substrate. Alternatively, the LEDs and the light sensor(s) are mounted on different but essentially co-planar substrates.

In general, light-emitting diodes have relatively high source brightness. Preferably, each of the LEDs has a radiant power output of at least 25 mW when driven at nominal power and at room temperature. LEDs having such a high output are also referred to as LED power packages. The use of such high-efficiency, high-output LEDs has the specific advantage that, at a desired, comparatively high light output, the number of LEDs may be comparatively small. This has a positive effect on the compactness and the efficiency of the illumination system to be manufactured. If LED power packages are mounted on such a (metal-core) printed circuit board 5, the heat generated by the LEDs can be readily dissipated by heat conduction via the PCB.

In a favorable embodiment of the illumination system, the (metal-core) printed circuit board 5 is in contact with a housing 15 of the illumination system via a heat-conducting connection. The housing 15 acts as heat sink for the light emitters R, G, B. Preferably, so-called naked-power LED chips are mounted on a substrate, such as for instance an insulated metal substrate, a silicon substrate, a ceramic or a composite substrate. The substrate provides electrical connection to the chip and acts as well as a good heat transportation section to transfer heat to a heat exchanger.

The embodiment of the illumination system as shown in FIG. 1 is rotation symmetrical around a longitudinal axis 25 and comprises a light-collimator 1 for collimating light emitted by the light emitters R, G, B. Light propagation in the light-collimator 1 is based on total internal reflection (TIR) towards a light-exit window 4 of the light-collimator 1. Preferably, the light-collimator 1 is made of a non-gaseous, optically transparent dielectric material. Preferably, the light-collimator 1 is made of a dielectric material with a refractive index larger than or equal to 1.3. Preferably, each of the light emitters R, G, B is in optical contact with the light-collimator 1 thereby reducing light losses in the illumination system.

The embodiment of the illumination system as shown in FIG. 1 further comprises a light sensor 8 for optical feedback being placed outside the light-collimator 1. The light sensor 8 is arranged to receive light emitted by the light emitters R,G,B exclusively through reflection at the light-exit window 4 of the light-collimator 1. The arrows in FIG. 1 show a light beam 2 emitted by one of the light emitters which is partially transmitted through the light-exit window 4 of the light collimator 1 and partially reflected at the light exit window 4. Part of the (Fresnel) reflections at the interface between the light-collimator and air is outside total internal reflection (TIR) when this reflected light hits a (curved) side wall of the collimator 1 again. The reflected light is coupled out of the light-collimator 1 at the side wall of the light-collimator 1 and reaches the light sensor 8.

In the example of FIG. 1, the light sensor 8 is positioned in the housing 1 and mounted on the printed circuit board 5. This simplifies assembling the illumination system. In addition, the light sensor is arranged substantially coplanar with the light emitters R, G, B. By placing the light sensor 8 outside the light-collimator 1 and by measuring the light emitted by the light emitters R, G, B exclusively through reflection, the color mixing of the light in the illumination system according to the invention is obtained with high accuracy. Direct light emitted by the light emitters R, G, B hitting the light sensor 8 is avoided. In this manner, the direct light emitted by a certain light emitter is not dominating the color sensing in the light sensor 8. According to the invention, an illumination system with an accurate sensing of the color mixing of the light emitted by the illumination system is obtained.

The light sensor 8 is connected to a controller (not shown in FIG. 1) for controlling the electrical current of the light emitters (R, G, B) in response to the light received by the light sensor 8. The light sensor 8 or photo diode is placed next to the TIR collimator 1 to detect the amount of flux emitted by the LEDs. Preferably, time resolved detection is used, which is synchronized with the pulse-width modulated driving of the LED chips. This is particularly helpful in case of an illumination system with a variety of primary colors enabling the measurement of the flux for each primary color individually and independently.

Preferably, the reading of the light sensor 8 is synchronized with the driver of the LED chips making the measurement insensitive to ambient light. The signal of the light sensor 8 may either be read continuously, or at (relatively large) time intervals in case the output of the illumination system should be stable over time with a constant level and color point. For these measurements the driver could be configured to change its scheme during the measurement time, without making this visible in the output of the illumination system.

There are various manners in which the controller can detect and influence the currents through the light emitters. In one embodiment, the controller employs frequency-resolved detection in combination with a driving scheme of the light emitters R, G, B that operates in pre-defined frequency bands. In an alternative embodiment, the illumination system comprises at least two sensors provided with color filters for determining a color point of the light emitted by the illumination system, the controller influencing the color point of the light emitted by the illumination system.

Preferably, the illumination system is further provided with a thermal sensor (not shown in FIG. 1) in the vicinity of the light emitters, the controller controlling the electrical current of the light emitters R, G, B in response to the information received from the thermal sensor. In this manner, the control system provides the appropriate currents to the light emitters, such that the optical characteristics of the light emitted from the illumination system corresponds with the desired settings, is based on input signals from at least one optical sensor in combination with at least one thermal sensor. Alternatively, the temperature of the light emitter is derived from the voltage at a predefined current, which is a function of temperature. In this manner, no separate temperature sensor is required and the temperature of the light emitter is derived from a calibration curve that provides the relation between the temperature and the electrical characteristics of the light emitters. Preferably, this information is combined with the signals from the optical sensors for accurately setting and maintaining the output of the lighting system by means of a feed back and/or feed forward control system.

The embodiment of the illumination system as shown in FIG. 1 further comprises a reflector 12. This reflector further collimates the beam of light emitted by the illumination system (see the arrows in FIG. 1). In the embodiment of FIG. 1, the reflector 12 is facetted for further shaping and for further homogenizing the light beam emitted by the illumination system. In an alternative embodiment, the reflector is substantially shaped according to a compound parabolic concentrator (CPC). In an alternative embodiment, the shape of the light-collimator is similar to but not exactly the shape of a compound parabolic concentrator.

Figure 2:
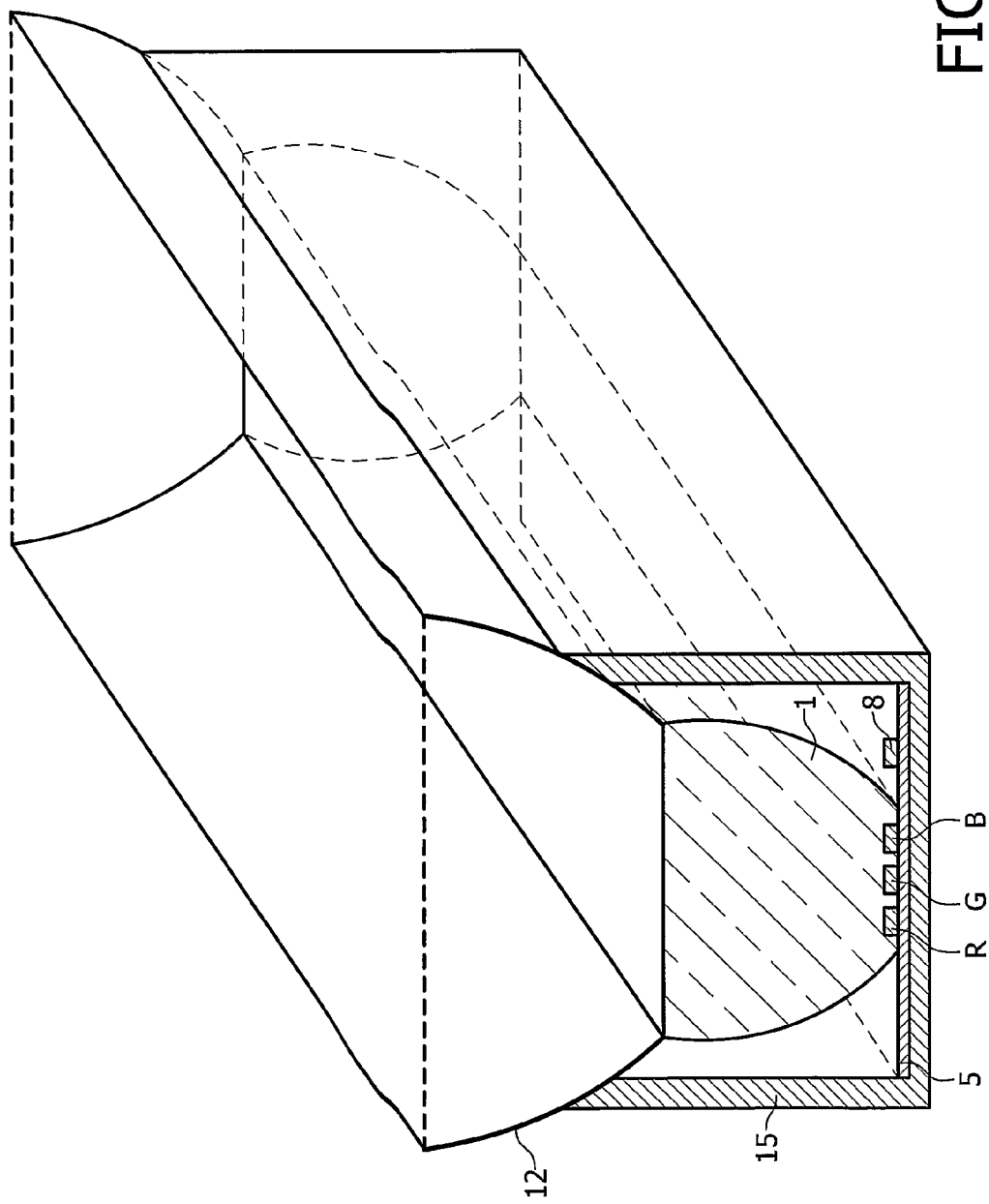
FIG. 2 is a perspective view of an embodiment of the illumination system as shown in FIG. 1.

The illumination system may either be a spot or flood module in which the TIR collimator is at least partly facetted and more or less rotationally symmetric, or a linear light source in which the TIR collimator is a linear structure. An example of a linear light source is shown in FIG. 2 schematically showing a perspective view of the embodiment of the illumination system as shown in FIG. 1. The illumination system in FIG. 2 comprises a plurality of light emitters R, G, B, a collimator 1, a light sensor 8 and a reflector 12. Only three light emitters are shown in FIG. 2, however, there may be a plurality of light emitters of primary colors. In addition, a plurality of light sensors 8 may be provided in the illumination system. In particular there may be one or more linear arrays of light emitters and one or more linear arrays of light sensors.

Figure 3:
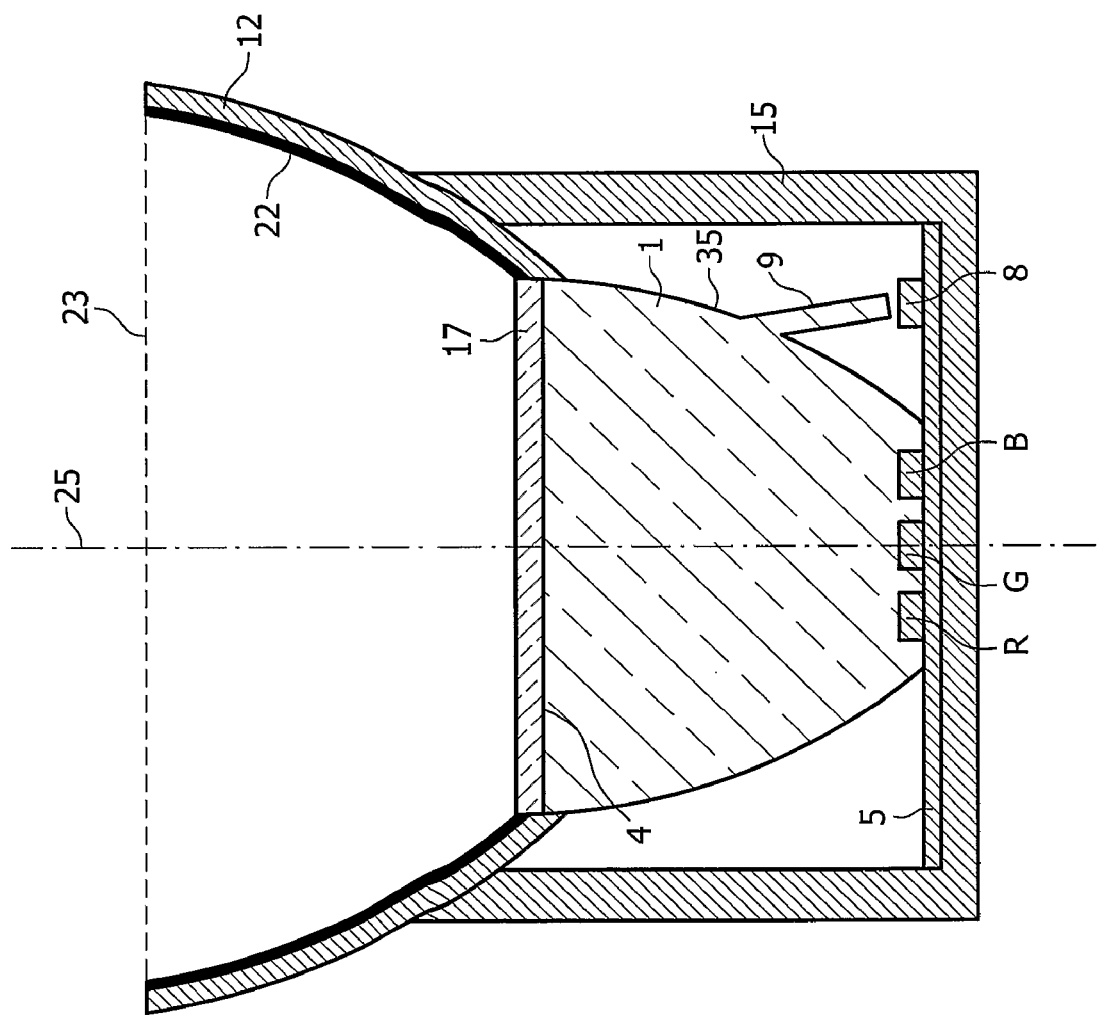
FIG. 3 is a cross-sectional view of an alternative embodiment of the illumination system according to the invention.

FIG. 3 schematically shows a cross-sectional view of an alternative embodiment of the illumination system according to the invention. In this embodiment a side wall 35 of the light-collimator 1 is provided with a protruding portion 9 for guiding the light reflected at the light-exit window 4 of the light-collimator 1 towards the light sensor 8. This protruding portion 9 functions as a (narrow) (circular) light guiding rod from the side wall 35 of the collimator 1 to the light sensor 8. The protruding portion 9 effectively guides reflected light to the light sensor 8. The cross section of the protruding portion 9 at the connection of the side wall of the light-collimator is, preferably, optimized to minimize distortion of the color mixing in the light-collimator 1 and to sufficiently guide light towards the light sensor 8.

In case a front lens or transparent/translucent front plate is used, for instance at the location of the exit-widow 23 of the reflector 12, also the light reflected at such a front plate can be used for the flux detection in the light sensor 8. In that case an anti-reflection coating may be provided on the collimator for reducing optical losses without affecting the flux measurement. According to the invention, light can be reflected at any possible interface located between the light collimator and the light-exit window of the illumination system. Suitable reflection surfaces are, for example, the light-exit window 4 of the light-collimator 1 or the light-exit window 23 of the reflector 12.

A favorable embodiment of the illumination system comprises a textured refractive light spreader, for example, a micro lens array, the textured light spreader being provided at a light-exit window 23 of the reflector 12.

In the example of FIG. 3, the reflector 12 comprises an additional heat sink functionality of the illumination system. In addition, the reflector 12 in FIG. 3 is provided with a (specular) reflective coating 22.

In the example of FIG. 3, the illumination system further comprises a holographic diffuser 17. Preferably, the holographic diffuser is a randomized holographic diffuser. The primary effect of the holographic diffuser is that a substantially uniform spatial and angular color and light distribution is obtained. In an alternative embodiment, the holographic diffuser 17 is provided at the exit window 23 of the reflector 12.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An illumination system comprising:
   a plurality of light emitters,
   a light-collimator for collimating light emitted by the light emitters,
   light propagation in the light-collimator being based on total internal reflection,
   at least one light sensor for optical feedback being placed outside the light-collimator,
   the light sensor being arranged to receive light emitted by the light emitters exclusively through reflection at a light-exit window of the illumination system,
   wherein the light sensor is connected to a controller for controlling the electrical current of the light emitters in response to the light received by the light sensor.

2. An illumination system as claimed in claim 1, wherein the light sensor is placed substantially coplanar with the light emitters.

3. An illumination system as claimed in claim 1, wherein the controller employs time-resolved detection.

4. An illumination system as claimed in claim 1, wherein detection in the controller is synchronous with pulse-width driving of the light-emitters.

5. An illumination system as claimed in claim 1, wherein the controller employs frequency-resolved detection in combination with a driving scheme of the light emitters that operates in pre-defined frequency bands.

6. An illumination system as claimed in claim 1, wherein the illumination system comprises at least two sensors provided with color filters for determining a color point of the light emitted by the illumination system, the controller influencing the color of the point of the light emitted by the illumination system.

7. An illumination system as claimed in claim 1, wherein the illumination system further comprises a thermal sensor, the controller controlling the electrical current of the light emitters in response to the information received from the thermal sensor.

8. An illumination system as claimed in claim 1, wherein the light-collimator is made from a dielectric material with a refractive index larger than or equal to 1.3.

9. An illumination system as claimed in claim 1, wherein the light emitters comprise at least a first light-emitting diode (R) of a first primary color, at least a second light-emitting diode (G) or a second primary color, and at least a third light-emitting diode (B) of a third primary color, the three primary colors being distinct from each other.

10. An illumination system as claimed in claim 9, wherein each of the the first, second, and third light-emitting diodes has a radiant power output of at least 25 mW when driven at nominal power and at room temperature.

11. An illumination system comprising:

a plurality of light emitters, a light-collimator for collimating light emitted by the light emitters, light propagation in the light-collimator being based on total internal reflection, at least one light sensor for optical feedback being placed outside the light-collimator, the light sensor being arranged to receive light emitted by the light emitters exclusively through reflection at a light-exit window of the illumination system, wherein a side wall of the light-collimator is provided with a protruding portion for guiding the light reflected at the light-exit window of the light-collimator towards the light sensor.

12. An illumination system comprising:

a plurality of light emitters, a light-collimator for collimating light emitted by the light emitters, propagation in the light-collimator being based on total internal reflection, at least one light sensor for optical feedback being placed outside the light-collimator, the light sensor being arranged to receive light emitted by the light emitters exclusively through reflection at a light-exit window of the illumination system, wherein the illumination system comprises a holographic diffuser, the holographic diffuser being provided at the light-exit window of the light-collimator.

13. An illumination system comprising:

a plurality of light emitters, a light-collimator for collimating light emitted by the light emitters, light propagation in the light-collimator being based on total internal reflection, at least one light sensor for optical feedback being placed outside the light-collimator, the light sensor being arranged to receive light emitted by the light emitters exclusively through reflection at a light-exit window of the illumination system, wherein the light-collimator is provided with a reflector, and wherein the reflector is facetted or is shaped substantially according to a compound parabolic concentrator.

14. An illumination system as claimed in claim 13, wherein the illumination system comprises a holographic diffuser, the holographic diffuser being provided at a light-exit window of the reflector.

15. An illumination system comprising:

a plurality of light emitters, a light-collimator for collimating light emitted by the light emitters, light propagation in the light-collimator being based on total internal reflection, at least one light sensor for optical feedback being placed outside the light-collimator, the light sensor being arranged to receive light emitted by the light emitters exclusively through reflection at a light-exit window of the illumination system, wherein the light emitters comprise at least a first light-emitting diode of a first primary color and at least a second light-emitting diode of a second primary color, the first and the second primary colors being distinct from each other.

* * * * *